United States Patent
Yang et al.

(10) Patent No.: US 10,796,759 B2
(45) Date of Patent: *Oct. 6, 2020

(54) METHOD AND APPARATUS FOR READING RRAM CELL

(71) Applicant: Taiwan Semiconductor Manufacturing Co., Ltd., Hsin-Chu (TW)

(72) Inventors: Chin-Chieh Yang, New Taipei (TW); Chih-Yang Chang, Yuanlin Township (TW); Chang-Sheng Liao, Zhudong Township (TW); Hsia-Wei Chen, Taipei (TW); Jen-Sheng Yang, Keelung (TW); Kuo-Chi Tu, Hsin-Chu (TW); Sheng-Hung Shih, Hsinchu (TW); Wen-Ting Chu, Kaohsiung (TW); Manish Kumar Singh, Hsin-Chu (TW); Chi-Tsai Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/413,937

(22) Filed: May 16, 2019

(65) Prior Publication Data
US 2019/0272873 A1 Sep. 5, 2019

Related U.S. Application Data

(63) Continuation of application No. 15/937,257, filed on Mar. 27, 2018, now Pat. No. 10,311,952, which is a (Continued)

(51) Int. Cl.
*G11C 11/00* (2006.01)
*G11C 13/00* (2006.01)
*G11C 11/16* (2006.01)

(52) U.S. Cl.
CPC ........ *G11C 13/004* (2013.01); *G11C 11/1653* (2013.01); *G11C 11/1655* (2013.01);
(Continued)

(58) Field of Classification Search
CPC .............. G11C 13/004; G11C 11/1653; G11C 11/1655
(Continued)

(56) References Cited

U.S. PATENT DOCUMENTS

| 7,092,277 B2 | 8/2006 | Bedeschi et al. |
| 2008/0025070 A1 | 1/2008 | Horii et al. |

(Continued)

FOREIGN PATENT DOCUMENTS

| TW | I514392 B | 12/2015 |
| TW | 201606768 A | 2/2016 |

OTHER PUBLICATIONS

Ytterdal, et al. "Device Modeling for Analog and RF CMOS Circuit Design." ISBN: 0-471-49869-6. Published in 2003.
(Continued)

*Primary Examiner* — Vu A Le
(74) *Attorney, Agent, or Firm* — Eschweiler & Potashnik, LLC (57) ABSTRACT

The present disclosure, in some embodiments, relates to a method of operating a resistive random access memory (RRAM) array. The method includes applying a word-line voltage to a selected word-line during a read operation. A non-zero voltage is applied to a selected bit-line during the read operation. A first voltage is applied to a selected source-line during the read operation. The first voltage is smaller than a second voltage applied to an unselected source-line during the read operation.

20 Claims, 6 Drawing Sheets

Related U.S. Application Data continuation of application No. 15/425,213, filed on Feb. 6, 2017, now Pat. No. 9,934,853.

(60) Provisional application No. 62/295,700, filed on Feb. 16, 2016.

(52) U.S. Cl.
CPC ...... *G11C 11/1657* (2013.01); *G11C 11/1673* (2013.01); *G11C 13/0023* (2013.01); *G11C 13/0026* (2013.01); *G11C 13/0028* (2013.01); *G11C 2213/79* (2013.01); *G11C 2213/82* (2013.01)

(58) Field of Classification Search
USPC .................................................. 365/148, 158
See application file for complete search history.

(56) References Cited

U.S. PATENT DOCUMENTS

| | | |
|---|---|---|
| 2009/0067229 A1 | 3/2009 | Kang et al. |
| 2009/0296446 A1 | 12/2009 | Asao |
| 2012/0026777 A1 | 2/2012 | Kitagawa et al. |
| 2012/0069626 A1 | 3/2012 | Nakano et al. |
| 2012/0120710 A1 | 5/2012 | Rabkin et al. |
| 2013/0148405 A1 | 6/2013 | Kang et al. |
| 2013/0329485 A1 | 12/2013 | Takashima et al. |
| 2014/0036573 A1* | 2/2014 | Ishihara ............. G11C 13/0021 365/148 |
| 2014/0185362 A1 | 7/2014 | Haukness |
| 2015/0109849 A1 | 4/2015 | Tsai et al. |
| 2015/0364178 A1* | 12/2015 | Kim .................... G11C 11/1655 365/66 |
| 2016/0078934 A1* | 3/2016 | Sekar ................. G11C 13/0069 365/148 |
| 2016/0211016 A1 | 7/2016 | Tsai et al. |
| 2017/0178723 A1 | 6/2017 | Haukness |

OTHER PUBLICATIONS

Notice of Allowance dated Nov. 16, 2017 for U.S. Appl. No. 15/425,213.
Non-Final Office Action dated May 18, 2018 for U.S. Appl. No. 15/937,257.
Final Office Action dated Nov. 1, 2018 for U.S. Appl. No. 15/937,257.
Notice of Allowance dated Feb. 27, 2019 for U.S. Appl. No. 15/937,257.
Sung Hyun Jo et al., 'Self-limited RRAM with ON/OFF resistance ratio amplification', 2015 Symposium on VLSI Technology. Published on Jun. 16, 2015.
Leqi Zhang, 'Study of the Selector Element for Resistive Memory', Ku Leuven Arenberg Doctor School Faculty of Engineering Science, Haverly-Belgium, Oct. 2015. Published on Oct. 31, 2015. Uploaded to the USPTO's e-filing system in 15 parts.

* cited by examiner

| | Word-line | | Bit-line | | Select-line | |
|---|---|---|---|---|---|---|
| | Sel. | Unsel. | Sel. | Unsel. | Sel. | Unsel. |
| Forming | 1.1V | 0V | 2.8V-3.6V | 0V | 0V | 0V |
| Set | 1.1V | 0V | 1.6V-2.0V | 0V | 0V | 0V |
| Reset | 2.0 | 0V | 0V | 0V | 1.6V-2.0V | 0V |
| Read | 1.4V | 0V | 0.3V | 0.3V | 0V | 0.3V |
| | ↑ 502 | ↑ 504 | ↑ 506 | ↑ 508 | ↑ 510 | ↑ 512 |

METHOD AND APPARATUS FOR READING RRAM CELL

REFERENCE TO RELATED APPLICATIONS

This Application is a Continuation of U.S. application Ser. No. 15/937,257, filed on Mar. 27, 2018, which is a Continuation of U.S. application Ser. No. 15/425,213, filed on Feb. 6, 2017 (now U.S. Pat. No. 9,934,853, issued on Apr. 3, 2018), which claims the benefit of U.S. Provisional Application No. 62/295,700, filed on Feb. 16, 2016. The contents of the above-referenced Patent Applications are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random access memory (RRAM) is one promising candidate for a next generation non-volatile memory technology. RRAM has a simple structure, consumes a small cell area, has a low switching voltage and fast switching times, and is compatible with CMOS fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices generally comprise a layer of high-k dielectric material arranged between conductive electrodes disposed within a back-end-of-the-line (BEOL) metallization stack. RRAM devices are configured to operate based upon a process of reversible switching between resistive states. This reversible switching is enabled by selectively forming a conductive filament through the layer of high-k dielectric material. For example, the layer of high-k dielectric material, which is normally insulating, can be made to conduct by applying a voltage across the conductive electrodes to form a conductive filament extending through the layer of high-k dielectric material. An RRAM cell having a first (e.g., high) resistive state corresponds to a first data value (e.g., a logical '0') and an RRAM cell having a second (e.g., low) resistive state corresponds to a second data value (e.g., a logical '1').

In future technology nodes, the scaling of RRAM cells may be limited due to degradation in performance and reliability characteristics. For example, as the size of an RRAM cell decreases, a difference in currents (i.e., a read current window) between a first data state (e.g., a '0') and a second data state (e.g., a '1') also decreases, making it more difficult to accurately read data states from an RRAM cell. It has been appreciated that a size of the read current window can be increased by using a higher word-line voltage. However, the use of a higher word-line voltage increases a gate-source voltage ($V_{GS}$) on access transistors. The higher gate-source voltage ($V_{GS}$) can cause damage of a gate dielectric within the access transistors, resulting in reliability concerns (e.g., device failure).

The present disclosure relates to a resistive random access memory (RRAM) circuit comprising a bias element configured to improve a read current window of the RRAM circuit, and an associated method. In some embodiments, the RRAM circuit comprises an RRAM array having a plurality of RRAM cells. A word-line decoder is configured to apply a first read voltage to a word-line coupled to a row of RRAM cells comprising a selected RRAM cell. A bit-line decoder is configured to apply a second read voltage to a bit-line coupled to the selected RRAM cell. A bias element is configured to apply a non-zero bias voltage to bit-lines and select-lines coupled to unselected RRAM cells within the row of RRAM cells. By applying a non-zero bias voltage to bit-lines and select-lines coupled to unselected RRAM cells, a higher word-line voltage can be used during a read operation, thereby increasing a read current window of the RRAM circuit without damaging corresponding access transistors.

Figure 1:
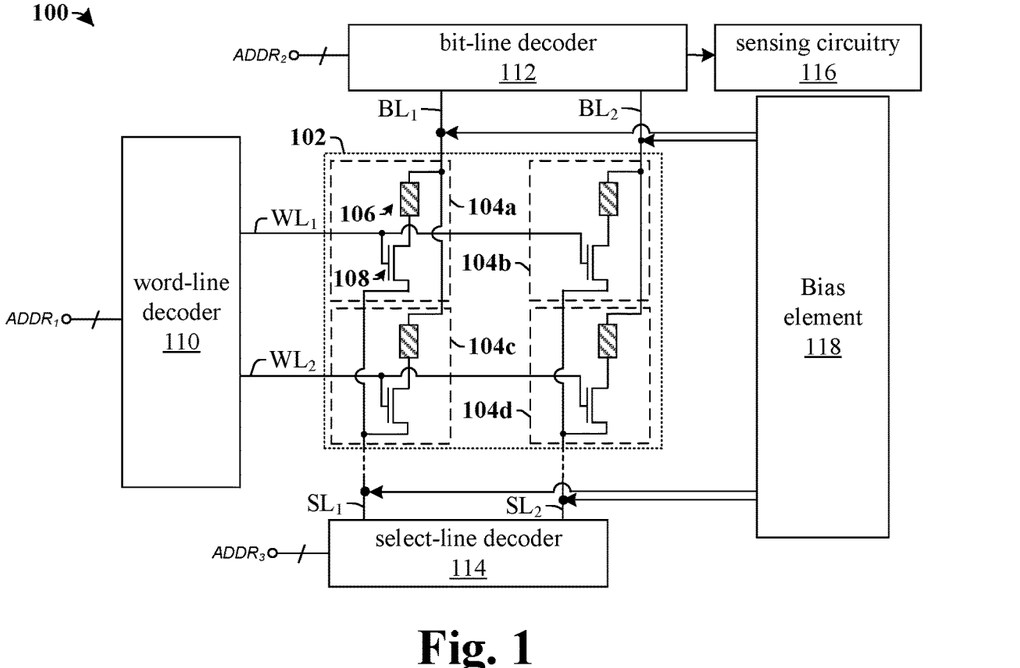
FIG. 1 illustrates some embodiments of a block diagram of a resistive random access memory (RRAM) circuit comprising a bias element configured to improve a read current window of the RRAM circuit.

FIG. 1 illustrates a block diagram of some embodiments of a resistive random access memory (RRAM) circuit 100 comprising a bias element that is configured to improve a read current window of the RRAM circuit.

The RRAM circuit 100 comprises an RRAM array 102 having a plurality of RRAM cells 104a-104d. The RRAM cells 104a-104d are arranged within the RRAM array 102 in rows and/or columns. RRAM cells 104a-104b or 104c-104d within a row of the RRAM array 102 are operably coupled to a word-line $WL_1$ or $WL_2$, respectively, while RRAM cells 104a-104c or 104b-104d within a column of the RRAM array 102 are operably coupled to a bit-line $BL_1$ or $BL_2$ and a select-line $SL_1$ or $SL_2$, respectively. The plurality of RRAM cells $104_a$-$104_d$ are respectively associated with an address defined by an intersection of a word-line $WL_1$ or $WL_2$ and a bit-line $BL_1$ or $BL_2$ and/or a select-line $SL_1$ or $SL_2$.

The plurality of RRAM cells 104a-104d respectively includes an RRAM device 106 and an access transistor 108. The RRAM device 106 has a resistive state that is switchable between a low resistive state and a high resistive state. The resistive states are indicative of a data value (e.g., a "1" or "0") stored within the RRAM device 106. The RRAM device 106 has a first terminal coupled to a bit-line $BL_1$ or $BL_2$ and a second terminal coupled to the access transistor 108. The access transistor 108 has a gate coupled to a word-line $WL_1$ or $WL_2$, a source coupled to a select-line $SL_1$ or $SL_2$ and a drain coupled to the second terminal of the RRAM device 106. By activating the word-line $WL_1$ or $WL_2$, the access transistor 108 is turned on, allowing for a select-line $SL_1$ or $SL_2$ to be coupled to the second terminal of the RRAM device 106.

The RRAM array 102 is coupled to support circuitry that is configured to read data from and/or write data to the plurality of RRAM cells 104a-104d. In some embodiments, the support circuitry comprises a word-line decoder 110, a bit-line decoder 112, a select-line decoder 114, and sensing circuitry 116. The word-line decoder 110 is configured to selectively apply a signal (e.g., a current and/or voltage) to one of the word-lines $WL_1$-$WL_2$ based upon a first address $ADDR_1$, the bit-line decoder 112 is configured to selectively apply a signal to one of the plurality of bit-lines $BL_1$-$BL_2$ based upon a second address $ADDR_2$, and the select-line decoder 114 is configured to selectively apply a signal to one of the plurality of select-lines $SL_1$-$SL_2$ based upon a third address $ADDR_3$. In some embodiments, the second address $ADDR_2$ and the third address $ADDR_3$ may be a same address.

By selectively applying signals to the word-lines $WL_1$-$WL_2$, the bit-lines $BL_1$-$BL_2$, and the select-lines $SL_1$-$SL_2$, the support circuitry is able to perform forming, set, reset, and read operations on selected ones of the plurality of RRAM cells 104a-104d. For example, to read data from RRAM cell 104a, the word-line decoder 110 applies a signal (e.g., voltage) to word-line $WL_1$, the bit-line decoder 112 applies a signal (e.g., voltage) to bit-line $BL_1$, and the select-line decoder 114 applies a signal (e.g., voltage) to select-line $SL_1$. The applied signals cause the sensing circuitry 116 to receive a signal (e.g., voltage) having a value that is dependent upon a data state of the RRAM cell 104a. The sensing circuitry 116 is configured to sense this signal and to determine the data state of the selected RRAM cell 104a based on the signal (e.g., by comparing a received voltage to a reference voltage).

The bit-lines $BL_1$-$BL_2$ and the select-lines $SL_1$-$SL_2$ are also coupled to a bias element 118. The bias element 118 is configured to selectively apply a non-zero bias voltage to bit-lines $BL_1$-$BL_2$ and/or select-lines $SL_1$-$SL_2$ coupled to unselected RRAM cells 104b within a row of RRAM cells that are coupled to an activated word-line during an operation of the RRAM array 102 (e.g., a read operation, a set operation, a reset operation). For example, if RRAM cell 104a is selected during a read operation, the bias element 118 may apply a non-zero bias voltage to bit-line $BL_2$ and select-line $SL_2$ during the operation.

Applying a non-zero bias voltage to bit-lines $BL_1$ or $BL_2$ and select-lines $SL_1$ or $SL_2$ coupled to unselected RRAM cell, achieves a smaller potential difference between voltages on a selected word-line and an unselected select-line and/or bit-line. The smaller potential difference reduces a voltage difference across a gate dielectric in access transistors 108 of unselected RRAM cells, and therefore allows for a higher word-line voltage to be used in an operation without increasing damage to the access transistors 108 of unselected RRAM cells. The use of a higher word-line voltage during a read operation can increase a read current window of an access transistor 108 within the selected RRAM cell.

Figure 2:
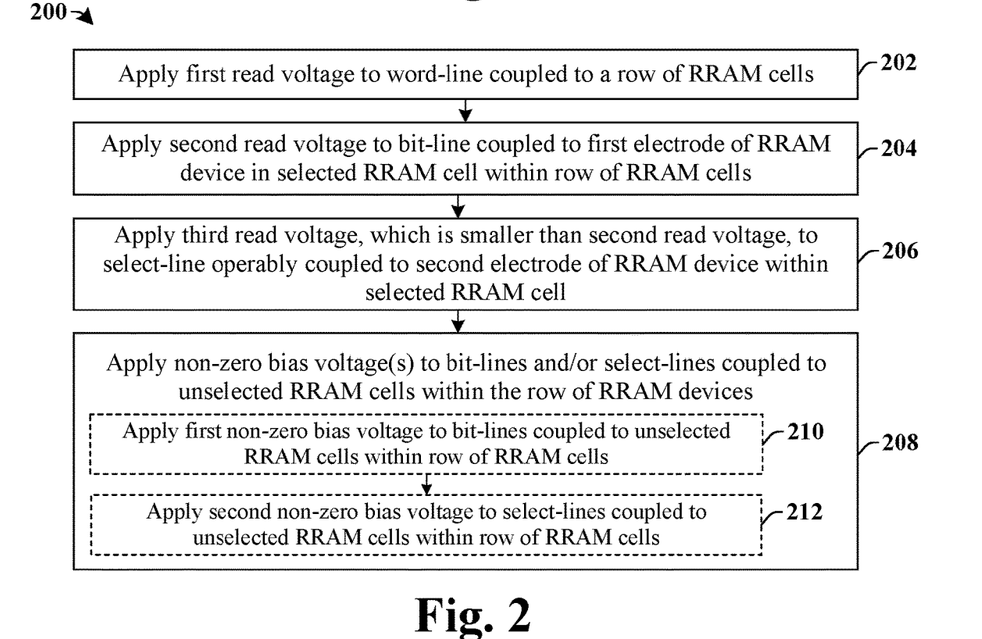
FIG. 2 illustrates a flow diagram of some embodiments of a method of performing a read operation on a RRAM circuit using bias voltages to improve a read current window of the RRAM circuit.

FIG. 2 illustrates a flow diagram of some embodiments of a method 200 of performing a read operation of an RRAM circuit using bias voltages to improve a read current window of the RRAM circuit.

While the disclosed method 200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a first read voltage is applied to a word-line coupled to a row of RRAM cells to activate the word-line. In some embodiments, the word-line may be coupled to gates of a plurality of access transistors within the row of RRAM cells.

At 204, a second read voltage is applied to a bit-line coupled to a first electrode of an RRAM device in a selected RRAM cell within the row of RRAM cells. The second read voltage may be a non-zero voltage having a value smaller than the first read voltage.

At 206, a third read voltage, which is smaller than the second read voltage, is applied to a select-line operably coupled to a second electrode of the RRAM device within the selected RRAM cell. In some embodiments, the third read voltage may be equal to a drain supply voltage ($V_{DD}$). In some embodiments, the third read voltage may be equal to substantially zero volts.

At 208, one or more non-zero bias voltages are applied to bit-lines and/or select-lines coupled to unselected RRAM cells within the row of RRAM cells. In some embodiments, act 208 may be performed according to acts 210 and 212.

At 210, a first non-zero bias voltage is applied to bit-lines coupled to unselected RRAM cells within the row of RRAM cells.

At 212, a second non-zero bias voltage is applied to select-lines coupled unselected RRAM cells within the row of RRAM cells.

It will be appreciated that the acts of method 200 may be performed in any order. For example, in some embodiments, one or more of the non-zero bias voltages may be applied to bit-lines and/or select-lines coupled to unselected RRAM cells (acts 210 and/or 212) prior to the application of the first read voltage (act 202), the second read voltage (act 204), and/or the third read voltage (act 206). In such embodiments, the application of the non-zero bias voltages prior to the application of the one or more read voltages may reduce damage to a gate dielectric of an access transistor by reducing a voltage difference across the gate dielectric (e.g., by applying the non-zero bias voltage prior to the first read voltage, an entirety of the first read voltage is not applied across a gate dielectric). In other embodiments, one or more of the non-zero bias voltages (acts 210 and/or 212) may be applied to bit-lines and/or select-lines coupled to unselected RRAM cells after the application of one or more of the read voltages (acts 202, 204, and/or 206).

Furthermore, while the method 200 describes the application of non-zero bias voltages to bit-lines and/or select-lines coupled to unselected RRAM cells during a read operation, the method is not limited to such operations. Rather, the application of non-zero bias voltages to bit-lines and/or select-lines coupled to unselected RRAM cells can be used during any RRAM operation (e.g., a read operation, a set operation, a reset operation) to reduce a voltage difference across the gate dielectric of an access transistor.

Figure 3:
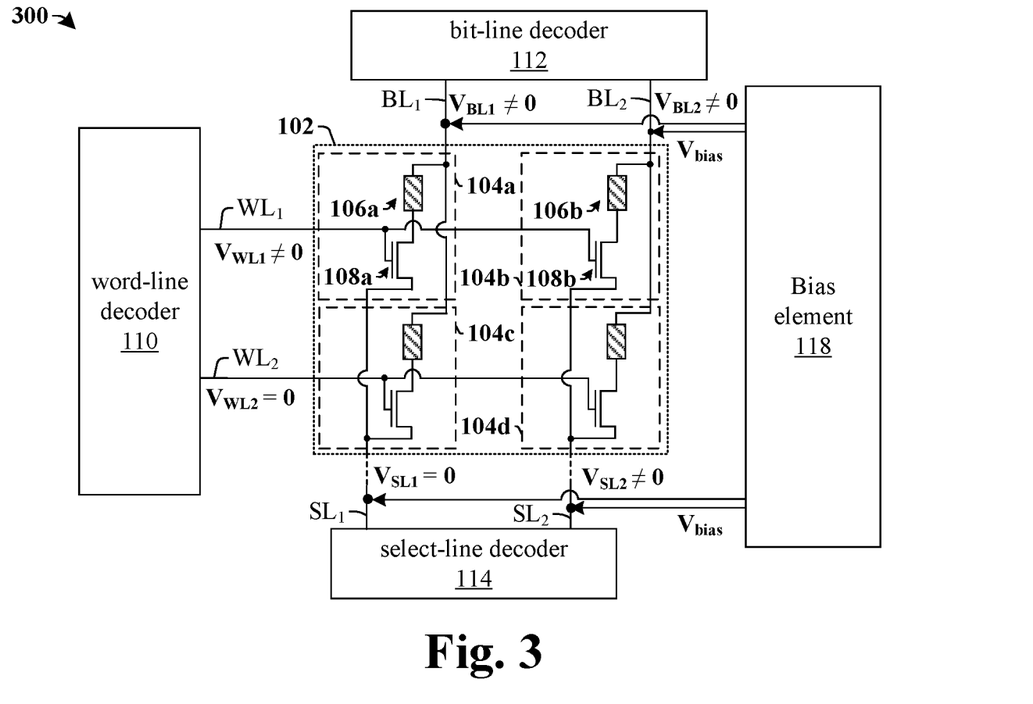
FIG. 3 illustrates some embodiments of a block diagram illustrating a method of performing a read operation on a disclosed RRAM circuit.

FIG. 3 illustrates some embodiments of a block diagram 300 illustrating a method of performing a read operation on a disclosed RRAM circuit.

As shown in FIG. 3, a first word-line voltage $V_{WL1}$ is applied to a first word-line $WL_1$ coupled to a first row of RRAM cells 104a-104b within an RRAM array 102 comprising a selected RRAM cell 104a. The first word-line voltage $V_{WL1}$ is provided to gates of access transistors 108 within the first row of RRAM cells 104a-104b. The first word-line voltage $V_{WL1}$ may have a non-zero voltage value (e.g., 1.4 V).

Within a selected RRAM cell 104a, a first bit-line voltage $V_{BL1}$ is applied to a first bit-line $BL_1$ coupled to a first electrode of an RRAM device 106a of the selected RRAM cell 104a. In some embodiments, the first bit-line voltage $V_{BL1}$ is equal to a sum of a non-zero voltage output from the bit-line decoder 112 and a substantially zero bias voltage output from the bias element 118. A first select-line voltage $V_{SL1}$ is applied to a first select-line $SL_1$ coupled to the access transistors 108a of the selected RRAM cell 104a. In some embodiments, the first select-line voltage $V_{SL1}$ may be equal to substantially zero volts. In some embodiments, the first select-line voltage $V_{SL1}$ is equal to a substantially zero voltage output from the select-line decoder 114 and a substantially zero bias voltage output of the bias element 118.

Within an unselected RRAM cell 104b, a second bit-line voltage $V_{BL2}$ is applied to a second bit-line $BL_2$ coupled to a first electrode of an RRAM device 106b of an unselected RRAM cell 104b. In some embodiments, the second bit-line voltage $V_{BL2}$ is equal to a sum of a substantially zero voltage output from the bit-line decoder 112 and a non-zero bias voltage output from the bias element 118. A second select-line voltage $V_{SL2}$ is applied to a second select-line $SL_2$ coupled to an access transistor 108b of the unselected RRAM cell 104b. In some embodiments, the second select-line voltage $V_{SL2}$ is equal to a sum of a substantially zero voltage output from the select-line decoder 114 and a non-zero bias voltage output from the bias element 118.

The threshold voltage ($V_{GS}$) of an access transistor, 108a or 108b, within an RRAM cell, 104a or 104b, is equal to a sum of the drain-source voltage ($V_{DS}$) and the gate-drain voltage ($V_{DG}$) (i.e., $V_{GS}=V_{DS}+V_{DG}$). The access transistor 108a within the selected RRAM cell 104a has a gate voltage that is equal to the first word-line voltage $V_{WL1}$, a drain voltage that is equal to the first bit-line voltage $V_{BL1}$, and a source voltage that is equal to the first select-line voltage $V_{SL1}$. The resulting threshold voltage ($V_{GS1}$) of the access transistor 108a within the selected RRAM cell 104a is equal to $(V_{BL1}-V_{SL1})+(V_{WL1}-V_{BL1})$ The access transistors 108b of the unselected RRAM cell 104b has a gate voltage that is equal to the first word-line voltage $V_{WL1}$, a drain voltage that is equal to the second bit-line voltage $V_{BL2}$, and a source voltage that is equal to the second select-line voltage $V_{SL2}$. The resulting threshold voltage ($V_{GS2}$) of the access transistors 108b within the unselected RRAM cell 104b is equal to $(V_{BL2}-V_{SL2})+(V_{WL2}-V_{BL2})$.

The difference between the first bit-line voltage $V_{BL1}$ and the first select-line voltage $V_{SL1}$ is larger than the difference between the second bit-line voltage $V_{BL2}$ and the second select-line voltage $V_{SL2}$, while the difference between the first word-line voltage $V_{WL1}$ and the first bit-line voltage $V_{BL1}$ is substantially equal to the difference between the first word-line voltage $V_{WL1}$ and the second bit-line voltage $V_{BL2}$. Thus, the threshold voltage ($V_{GS1}$) of the access transistors 108 within the selected RRAM cell 104a ($V_{GS1}=(V_{BL1}-V_{SL1})+(V_{WL1}-V_{BL1})$) is greater than the threshold voltage ($V_{GS2}$) of the access transistors 108 within the unselected RRAM cell 104b ($V_{GS2}=(V_{BL2}-V_{SL2})+(V_{WL2}-V_{BL2})$) (since the threshold voltage of an access transistor within an RRAM cell is controlled by the difference between the bit-line voltage and the select-line voltage applied to the RRAM cell).

Therefore, applying a non-zero bias voltage to a bit-line $BL_2$ and a select-line $SL_2$ coupled to an unselected RRAM cell 104b allows for the gate drain voltage ($V_{DG}$) to remain the same for access transistors, 108a and 108b, within both the selected RRAM cell 104a and the unselected RRAM cell 104b, while increasing a drain-source voltage ($V_{DS}$) (since $V_{DS}=V_{BL}-V_{SL}$) and a threshold voltage ($V_{GS2}=V_{DS2}-V_{GD2}$) on the access transistor 108a of the selected RRAM cell 104a relative to an access transistor 108b of the unselected RRAM cell 104b. In other words, applying a bias voltage to the bit-line $BL_2$ and select-line $SL_2$ coupled to the unselected RRAM cell 104b reduces a threshold voltage ($V_{GS2}=V_{DS2}-V_{GD2}$) on the access transistor 108b of the unselected RRAM cell 104b allowing for a larger word-line voltage $V_{WLx}$ to be applied during a read operation without damaging the access transistor 108b within the unselected RRAM cell 104b.

Figure 4:
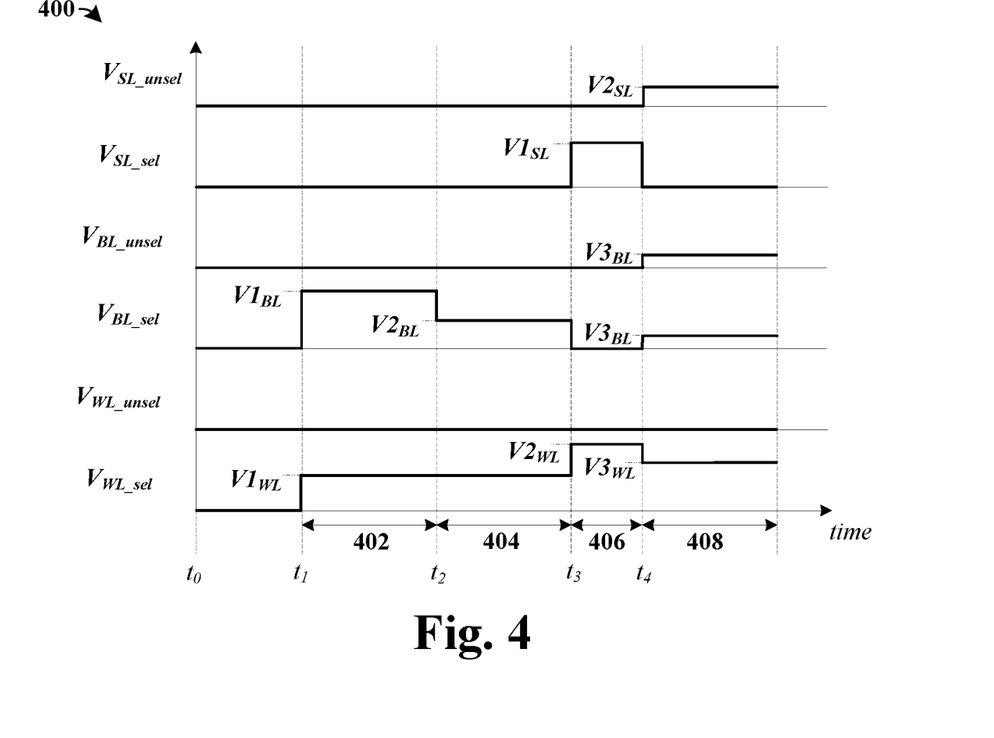
FIG. 4 illustrates some embodiments of a timing diagram illustrating a method of operating a disclosed RRAM circuit.

FIG. 4 illustrates some embodiments of a timing diagram 400 illustrating a method of operating a disclosed RRAM circuit. The timing diagram illustrates a forming operation 402 (in which an initial conductive filament is formed within an RRAM cell), a set operation 404 (in which a conductive filament is broken, resulting in a high resistive state), a reset operation 406 (in which a conductive filament is re-formed, resulting in a low resistive state), and a read operation 408.

As shown in timing diagram 400, an initial time $t_0$ no operation is performed on the RRAM circuit. No bias voltages are applied to any word-line, bit-lines, and/or select-lines of the RRAM circuit.

At a first time $t_1$, a forming operation is performed. During the forming operation 402, a voltage on a selected word-line $V_{WL\_sel}$ is held at a first word-line voltage $V1_{WL}$ and voltages on unselected word-lines $V_{WL\_unsel}$ are held at a low voltage (e.g., $V_{DD}$ or 0 volts). A voltage on a selected bit-line $V_{BL\_sel}$ is held at a first bit-line voltage $V1_{BL}$ and a voltage on unselected bit-lines $V_{BL\_unsel}$ are held at a low voltage (e.g., $V_{DD}$ or 0 volts). Voltages on selected and unselected select-lines, $V_{SL\_sel}$ and $V_{SL\_unsel}$, are held at a low voltage (e.g., $V_{DD}$ or 0 volts). The first word-line voltage $V1_{WL}$ turns on access transistors within RRAM cells in a row of an RRAM array, to form a conductive path between RRAM devices within the row and a plurality of select-lines $SL_1$-$SL_n$. The voltages on the selected bit-line $V_{BL\_sel}$ and the selected select-line $V_{SL\_sel}$ form a large voltage difference between electrodes of an RRAM device within a selected RRAM cell. The large voltage difference drives current through a layer of dielectric material within the RRAM device, causing an initial conductive filament to be formed within the RRAM device (e.g., by generating thermal energy and/or an electromagnetic force that causes oxygen vacancy migration in the layer of dielectric material layer to form the initial conductive filament).

At a second time $t_2$, a set operation 404 is performed. During the set operation 404, a voltage on a selected word-line $V_{WL\_sel}$ is held at the first word-line voltage $V1_{WL}$ and voltages on unselected word-lines $V_{WL\_unsel}$ are held at a low voltage (e.g., $V_{DD}$ or 0 volts). A voltage on a selected bit-line $V_{BL\_sel}$ is held at a second bit-line voltage $V2_{BL}$ and a voltage on unselected bit-lines $V_{BL\_unsel}$ are held at a low voltage (e.g., $V_{DD}$ or 0 volts). In some embodiments, the second bit-line voltage $V2_{BL}$ may be smaller than the first bit-line voltage $V1_{BL}$. Voltages on selected and unselected select-lines, $V_{SL\_sel}$ and $V_{SL\_unsel}$, are held at a low voltage (e.g., $V_{DD}$ or 0 volts). The first word-line voltage $V1_{WL}$ turns on access transistors within RRAM cells in a row of an RRAM array to form a conductive path between RRAM devices within the row of the RRAM array and a plurality of select-lines $SL_1$-$SL_n$. The voltages on the selected bit-line $V_{BL\_sel}$ and the selected select-line $V_{SL\_sel}$ form a voltage difference that drives current through the layer of dielectric material within an RRAM device within a selected RRAM cell. Since there is an existing filament in the RRAM device, the set operation 404 may use a smaller voltage difference (e.g., a smaller bit-line voltage) than the initial forming operation 402.

At a third time $t_3$, a reset operation 406 is performed. During the reset operation 406, a voltage on a selected word-line $V_{WL\_sel}$ is held at a second word-line voltage $V2_{WL}$ and voltages on unselected word-lines $V_{WL\_unsel}$ are held at a low voltage (e.g., $V_{DD}$ or 0 volts). Voltages on selected and unselected bit-lines, $V_{BL\_sel}$ and $V_{BL\_unsel}$, are held at a low voltage (e.g., $V_{DD}$ or 0 volts). A voltage on a selected select-line $V_{SL\_sel}$ is held at a first select-line voltage $V1_{SL}$ and voltages on unselected select-lines $V_{SL\_unsel}$ are held at a low voltage (e.g., $V_{DD}$ or 0 volts). The second word-line voltage $V2_{WL}$ turns on access transistors within RRAM cells in a row of an RRAM array to form a conductive path between RRAM devices within the row of the RRAM array and a plurality of select-lines $SL_1$-$SL_n$. The voltages on the selected bit-line $V_{BL\_sel}$ and the selected select-line $V_{SL\_sel}$ form a voltage difference that drives current through the layer of dielectric material within an RRAM device within a selected RRAM cell (in an opposite direction as the set operation) to break a conductive filament within the RRAM device.

At a fourth time $t_4$, a read operation 408 is performed. During the read operation 408, a voltage on a selected word-line $V_{WL\_sel}$ is held at a third word-line voltage $V3_{WL}$ and voltages on unselected word-lines $V_{WL\_unsel}$ are held at a low voltage (e.g., $V_{DD}$ or 0 volts). The third word-line voltage $V3_{WL}$ may be greater than the first word-line voltage $V_{1WL}$. Voltages on selected and unselected bit-lines, $V_{BL\_sel}$ and $V_{BL\_unsel}$, are held at a third bit-line voltage $V3_{BL}$. A voltage on a selected select-line $V_{SL\_sel}$ is held at a low voltage (e.g., $V_{DD}$ or 0 volts) and voltages on unselected select-lines $V_{SL\_unsel}$ are held at a second select-line voltage $V2_{SL}$ (i.e., a non-zero bias voltage). In some embodiments, the third bit-line voltage $V3_{BL}$ is substantially equal to the second select-line voltage $V2_{SL}$. The third word-line voltage $V3_{WL}$ turns on access transistors within RRAM cells in a row of an RRAM array to form a conductive path between RRAM devices within the row of the RRAM array and a plurality of select-lines $SL_1$-$SL_n$ and to form a voltage difference between electrodes of an RRAM device within a selected RRAM cell.

Figure 5A:
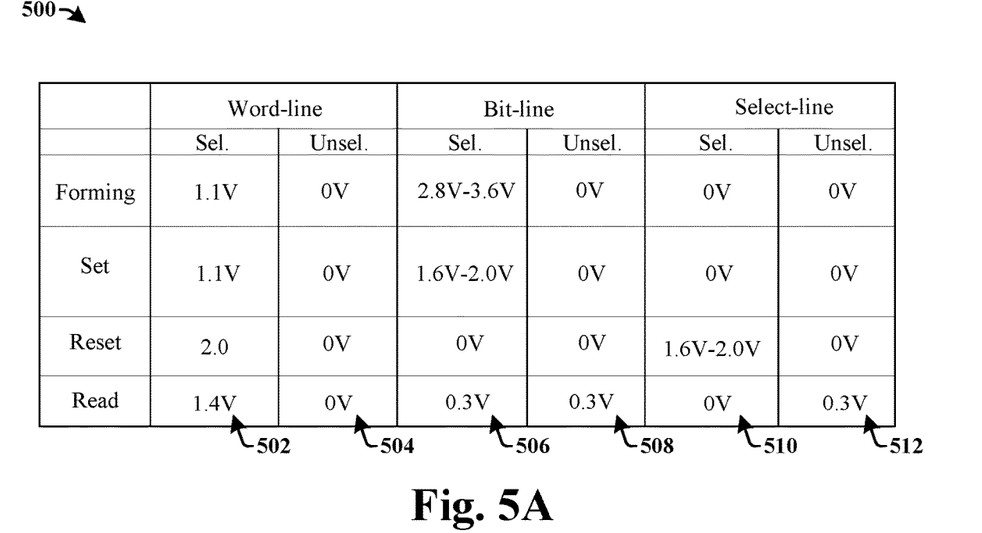
FIGS. 5A-5C illustrate some diagrams showing a more detailed embodiment of a method of operating an RRAM circuit.
Figure 5B:
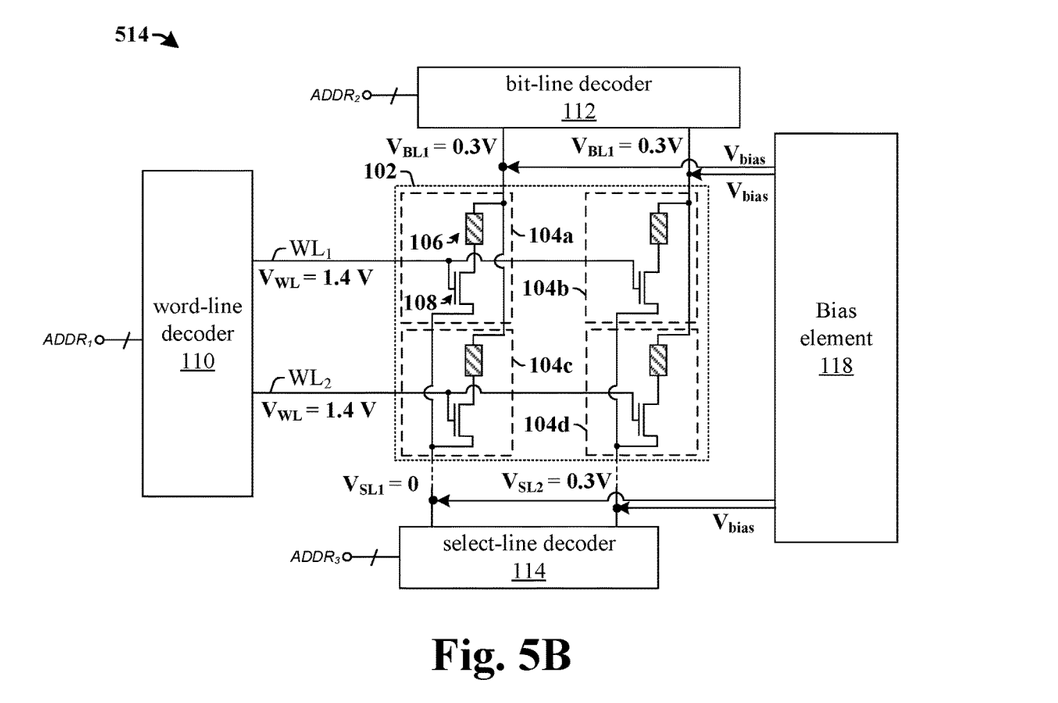
Figure 5C:
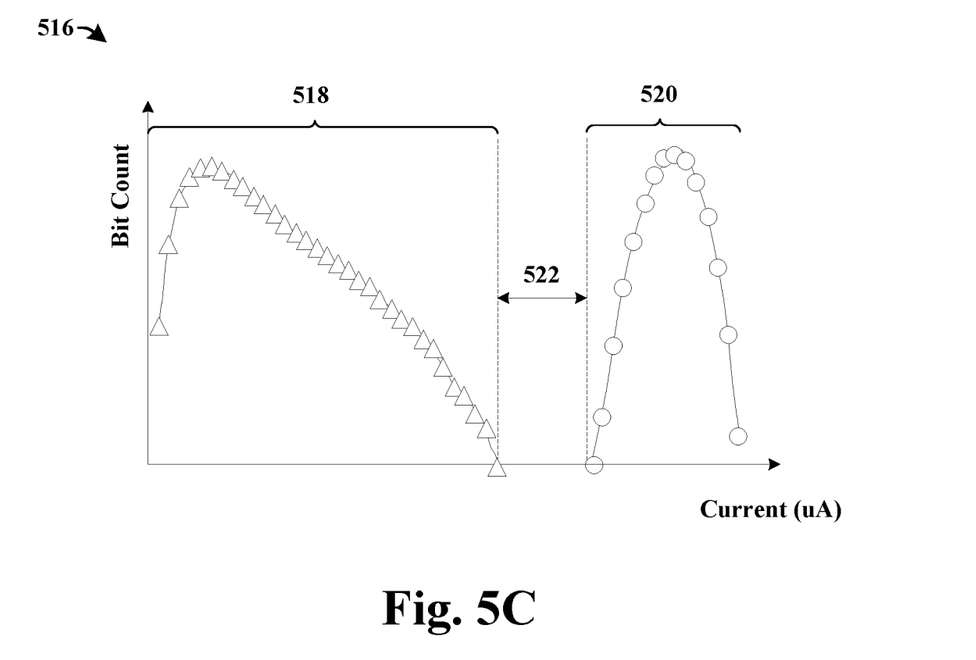

FIGS. 5A-5C illustrate some diagrams showing a more detailed embodiment of a method of operating an RRAM circuit. In the embodiments illustrated in FIGS. 5A-5C, a first word-line voltage used during a read operation has a value that is approximately equal to 1.4 volts. It has been appreciated that using a first word-line voltage having a value that is approximately equal to 1.4 volts improves a read current window of a selected RRAM cell. The use of a first word-line voltage having a value that is approximately equal to 1.4 volts is typically not a permissible word-line voltage that can be used during a read operation on an RRAM array since such a voltage may damage a gate dielectric of access transistors within unselected RRAM cells. However, the use of a bias voltage on bit-lines and select-lines coupled to unselected RRAM cells mitigates the damage to the access transistors and therefore allows for such word-line voltage to be used.

Although FIGS. 5A-5C are described in relation to an embodiment wherein a first word-line voltage has a value that is approximately equal to 1.4 volts, such an embodiment is not a limiting embodiment. Rather, in alternative embodiments, the first word-line voltage may have a value that is greater than 1.4 volts (e.g., 1.6 V, 1.8 V, etc.) or that is less than 1.4 volts (e.g., 1.2 V, etc.).

FIG. 5A illustrates a chart 500 showing some embodiments of exemplary voltages used to perform forming, set, reset, and read operations on an RRAM circuit.

As shown in chart 500, during a read operation a first word-line voltage 502 having a value that is approximately equal to 1.4 volts is applied to a word-line coupled to a row of RRAM cells comprising a selected RRAM cell, while a second word-line voltage 504 having a substantially zero voltage is applied to word-lines coupled to rows of RRAM cells not comprising the selected RRAM cell. First and second bit-line voltages, 506 and 508, having values approximately equal to 0.3 V are applied to bit-lines coupled to the selected RRAM cell and to unselected RRAM cells. In some embodiments, the bit-line voltage 506 may be generated by a bit-line decoder, while the second bit-line voltage 508 may be generated by a bias element. A first select-line voltage 510 having a substantially zero voltage is applied to a select-line operably coupled to a selected RRAM cell, while a second select-line voltage 512 having a value that is approximately equal to 0.3 V is applied to select-lines coupled to the unselected RRAM cells. In some embodiments, the second select-line voltage 512 may be generated by a bias element.

In some embodiments, a difference between the first word-line voltage 502 and a second bit-line voltage 508 may have a value that is approximately equal to a difference between a voltage of a selected word-line and a voltage of an unselected bit-line during a forming operation and/or a set operation.

FIG. 5B illustrates some embodiments of a block diagram 514 showing a read operation on an RRAM device 106 within a selected RRAM cell 104a by application of voltages set forth in FIG. 5A.

FIG. 5C illustrates some embodiments of a graph 516 showing a read current of an RRAM device for the voltages set forth in FIG. 5A. The graph shows a read current along an x-axis and a bit-count (i.e., a number of bits having a read current value) along a y-axis.

As shown in the graph 516, the read current has a first current range 518 for stored data states having a first value (e.g., for data states having a "0") and a second current range 520 for stored data states having a second value (e.g., for data states having a "1"). A difference between the first current range 518 and the second current range 520 is the read current window 522. The larger the read current window 522, the easier it is to differentiate the data states from one another during a read operation.

The application of a first word-line voltage 502 to a selected word-line, which has a value that is approximately equal to 1.4 volts, improves the read current window of an RRAM cell over smaller word-line voltages. For example, the application of a first word-line voltage 502, which has a value that is approximately equal to 1.4 volts, gives a read current window of approximately 11 micro-amperes (uA) in comparison to a read current window of approximately 6 uA for a word-line voltage of approximately 1.1 volts.

Figure 6:
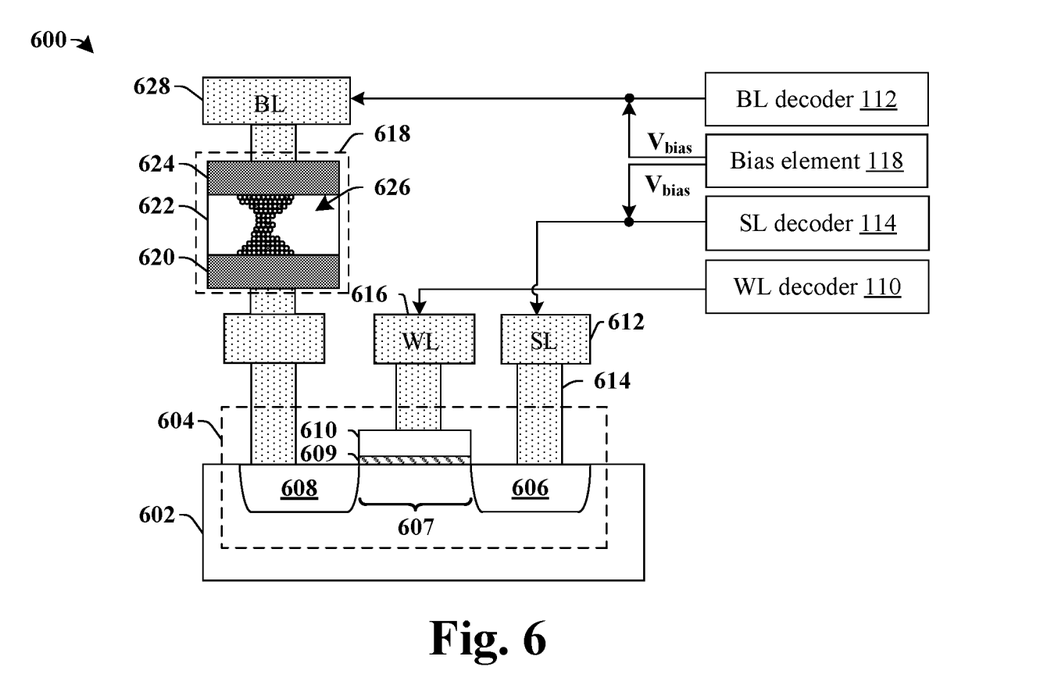
FIG. 6 illustrates some embodiments of a cross-sectional view of an integrated chip comprising a resistive random access memory (RRAM) cell coupled to a bias element.

FIG. 6 illustrates some embodiments of a cross-sectional view of an integrated chip 600 comprising a resistive random access memory (RRAM) cell coupled to a bias element.

The integrated chip 600 comprises an RRAM device 618 arranged over a substrate 602. In various embodiments, the substrate 602 may comprise any type of semiconductor body (e.g., silicon, SiGe, SOI) such as a semiconductor wafer and/or one or more die on a wafer, as well as any other type of metal layer, device, semiconductor and/or epitaxial layers, etc., associated therewith.

A transistor device 604 is arranged within the substrate 602. The transistor device 604 includes a source region 606 and a drain region 608 separated by a channel region 607. The transistor device 604 also comprises a gate electrode 610 separated from the channel region 607 by a gate dielectric 609. The source region 606 is coupled to a select-line 612 by way of one or more metal interconnect layers 614 (e.g., a metal wire, a metal via, and/or a conductive contact). The gate electrode 610 is coupled to a word-line 616 by way of one or more metal interconnect layers 614. The drain region 608 is coupled to a bottom electrode 620 of the RRAM device 618 by way of one or more metal interconnect layers 614.

The bottom electrode 620 of the RRAM device 618 is separated from an upper electrode 624 by way of a layer of dielectric material 622. A conductive filament 626, comprising a chain of oxygen vacancies, may extend through the layer of dielectric material 622 after a forming operation has been performed on the RRAM device 618. An upper metal via further couples the upper electrode 624 of the RRAM device 618 to a bit-line 628 formed within a metal interconnect layer overlying the RRAM device 618. In various embodiments, the bottom electrode 620 and the upper electrode 624 may comprise a conductive material such as platinum (Pt), aluminum-copper (AlCu), titanium nitride (TiN), gold (Au), titanium (Ti), tantalum (Ta), tantalum nitride (TaN), tungsten (W), tungsten nitride (WN), and/or copper (Cu), for example. In various embodiments, the layer of dielectric material 622 may comprise nickel oxide (NiO), titanium oxide (TiO), hafnium oxide (HfO), zirconium oxide (ZrO), zinc oxide (ZnO), tungsten oxide ($WO_3$), aluminum oxide ($Al_2O_3$), tantalum oxide (TaO), molybdenum oxide (MoO), and/or copper oxide (CuO), for example.

A word-line decoder 110 is coupled to the word-line 616, a bit-line decoder 112 is coupled to the bit-line 628, and a select-line decoder 114 is coupled to the select-line 612. The bit-line 628 and the select-line 612 are further coupled to a bias element 118 configured to selectively apply a bias voltage $V_{bias}$ to the bit-line BL and the select-line SL when RRAM device 618 is not selected to be read. In some embodiments, the word-line decoder 110, the bit-line decoder 112, and the select-line decoder 114 may be respectively coupled to the word-line 616, the bit-line 628, and the select-line 612 by way of back-end-of-the-line (BEOL) metal interconnect layers (e.g., copper wires and vias arranged within an inter-level dielectric structure). Similarly, the bit-line 628 and the select-line 612 may be coupled to the bias element 118 by way of BEOL metal interconnect layers (e.g., copper wires and vias arranged within an inter-level dielectric structure).

Although the integrated chip 600 is illustrated as having a 1T1R (one transistor, one resistor) RRAM device structure, it will be appreciated that in other embodiments the disclosed RRAM circuit can be applied with other RRAM device structures (e.g., a 2T2R). Furthermore, the select-line 612, word-line 616, and bit-line 628 can be located in different layers than shown in this example. Moreover, although the disclosed method and apparatus are described in relation to an RRAM cell, it will be appreciated that the disclosed method and apparatus are not limited to such a type of memory device. Rather, in alternative embodiments, the disclosed method and apparatus may be applied to other types of memory devices, such as a magnetoresistive random-access memory (MRAM) devices, for example.

Figure 7A:
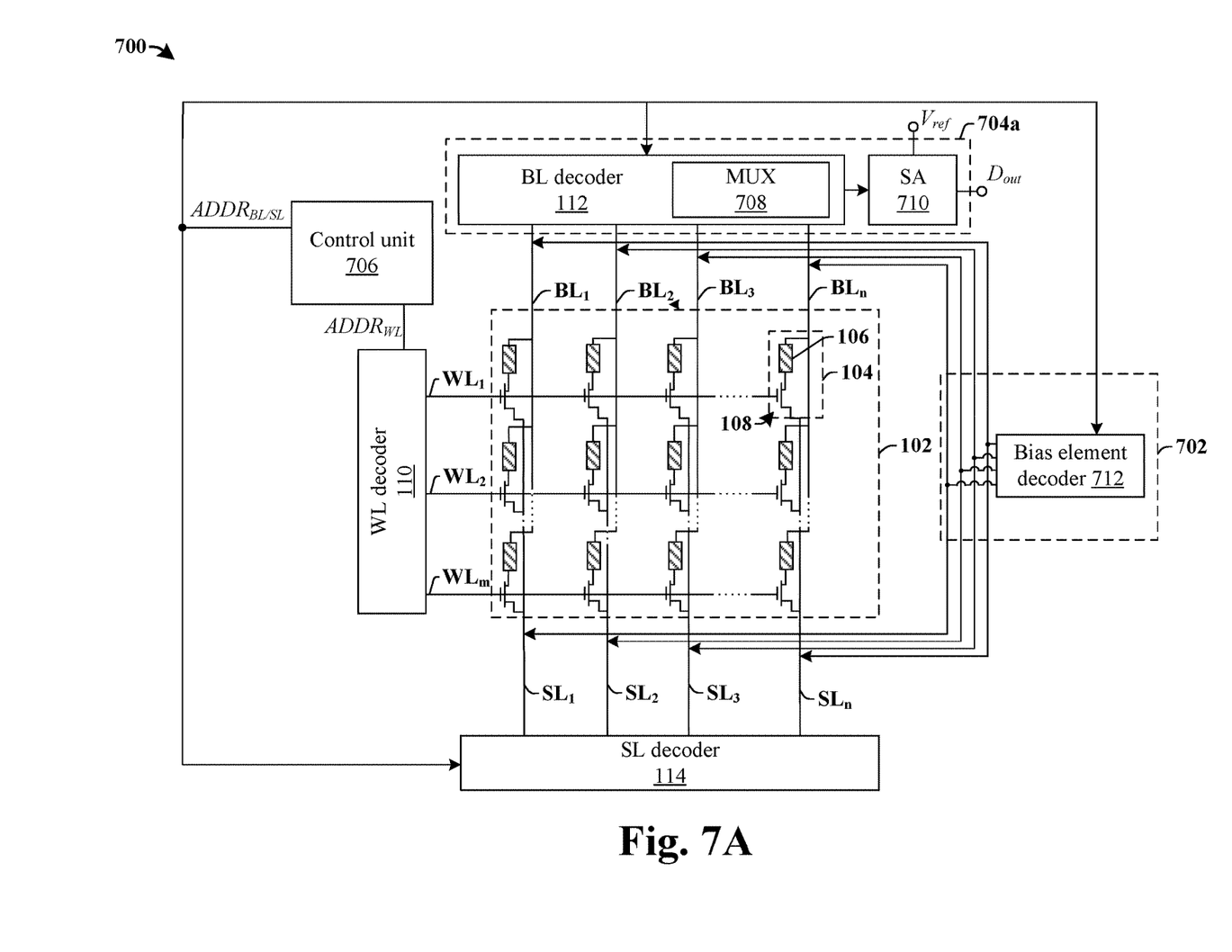
FIGS. 7A-7B illustrate block diagrams showing some embodiments of an RRAM circuit comprising an RRAM array coupled to a bias element.
Figure 7B:
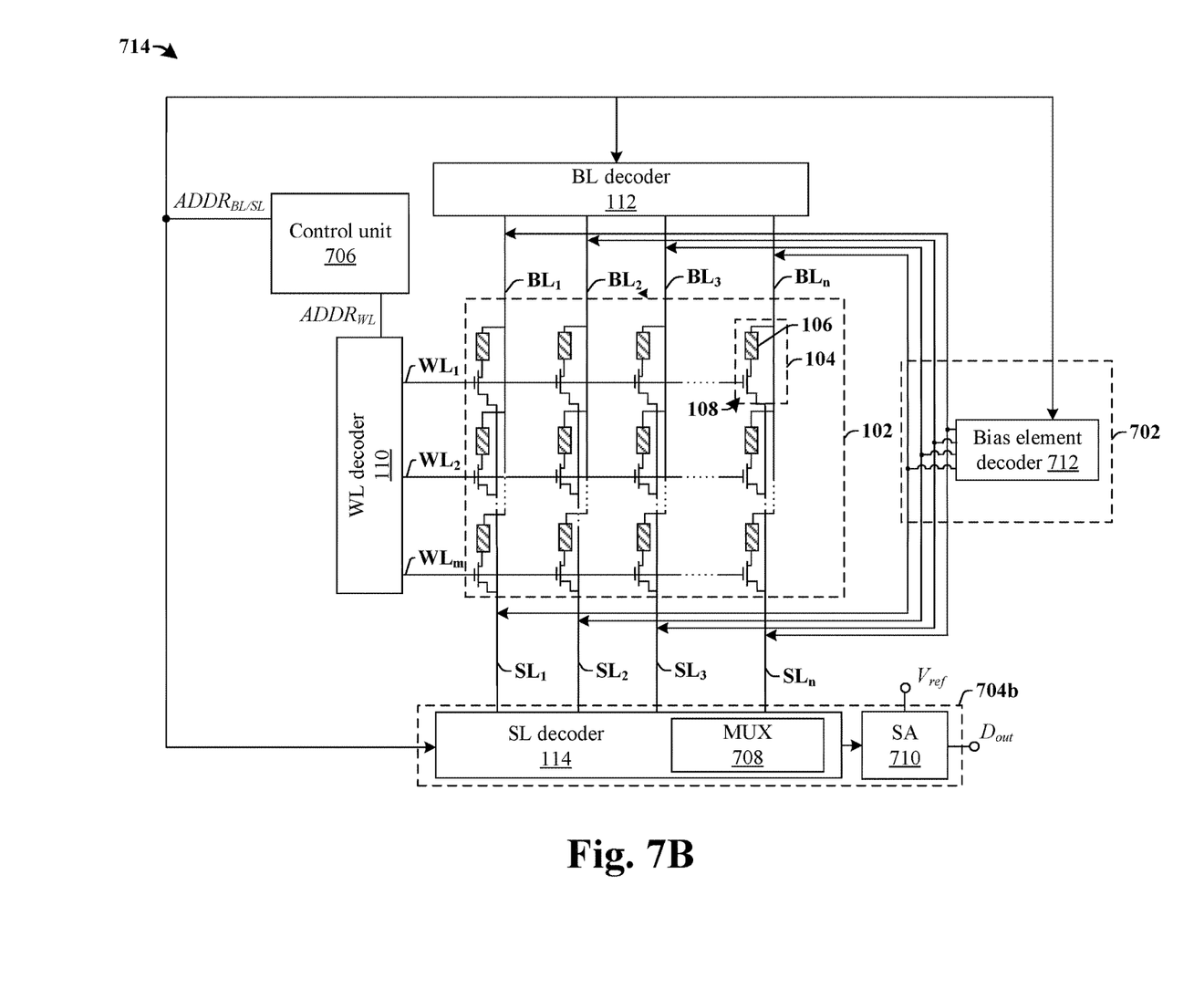

FIGS. 7A-7B illustrate block diagrams showing some embodiments of an RRAM circuit comprising an RRAM array coupled to a bias element.

As shown in FIG. 7A, an RRAM circuit 700 comprises an RRAM array 102 having a plurality of RRAM cells 104 respectively comprising an RRAM device 106 and an access transistor 108. A bias element 702 is selectively coupled to a plurality of bit-lines $BL_1$-$BL_n$ and a plurality of select-lines $SL_1$-$SL_n$ that are coupled to the plurality of RRAM cells 104. The bias element 702 is configured to provide a non-zero bias voltage to one or more of the plurality of bit-lines $BL_1$-$BL_n$ and/or the plurality of select-lines $SL_1$-$SL_n$ coupled to unselected RRAM cells during a read operation. In some embodiments, the bias element 702 may be configured to not apply a non-zero bias voltage to one or more of the plurality of bit-lines $BL_1$-$BL_n$ and a plurality of select-lines $SL_1$-$SL_n$ coupled to unselected RRAM cells during a forming operation, a set operation, and/or a reset operation.

The RRAM array 102 is coupled to a word-line decoder 110, a bit-line decoder 112, a select-line decoder 114, and sensing circuitry 704a. A control unit 706 is configured to provide one or more addresses to the word-line decoder 110, the bit-line decoder 112, and the select-line decoder 114. The one or more addresses comprise multi-bit signals that are decoded to determine which of the word-lines $WL_1$-$WL_m$, the bit-lines $BL_1$-$BL_n$, and the select-lines $SL_1$-$SL_n$ are activated during an operation (e.g., set, reset, read, etc.). For example, the word-line decoder 110 may be configured to selectively apply a signal (e.g., a current and/or voltage) to one of the word-lines $WL_1$-$WL_m$ based upon a first address $ADDR_{WL}$, the bit-line decoder 112 may be configured to selectively apply a signal to one of the plurality of bit-lines $BL_1$-$BL_n$ based upon a second address $ADDR_{BL/SL}$, and the select-line decoder 114 may be configured to selectively apply a signal to one of the plurality of select-lines $SL_1$-$SL_n$ based upon the second address $ADDR_{BL/SL}$.

The sensing circuitry 704a is configured to determine a data state within a selected one of the RRAM cells 104 during a read operation. In some embodiments, the sensing circuitry 206 may comprise a multiplexer 708 and a sense amplifier 710. In some embodiments, shown in FIG. 7A, the sensing circuitry 704a may be configured to read data by way of the bit-lines $BL_1$-$BL_n$. In some such embodiments, the multiplexer 708 may share one or more components with the bit-line decoder 112. During read operations, the multiplexer 708 is configured to receive signals from one or more of the plurality of bit-lines $BL_1$-$BL_n$ and based thereupon to selectively provide a signal to a sense amplifier 710. The sense amplifier 710 is configured to compare the received signal to a reference voltage $V_{ref}$ to generate an output data state $D_{out}$ (e.g., a "1" or a "0") corresponding to a data state stored in a selected RRAM cell.

In some alternative embodiments, shown in FIG. 7B, an RRAM circuit 714 may comprise sensing circuitry 704b configured to read data by way of the select-lines $SL_1$-$SL_n$. In some such embodiments, the multiplexer 708 may share one or more components with the select-line decoder 114. During read operations, the multiplexer 708 is configured to receive signals from one or more of the plurality of select-lines $SL_1$-$SL_n$ and based thereupon to selectively provide a signal to a sense amplifier 710. The sense amplifier 710 is configured to compare the received signal to a reference voltage $V_{ref}$ to generate an output data state $D_{out}$ (e.g., a "1" or a "0") corresponding to a data state stored in a selected RRAM cell.

In some embodiments, the control unit 706 may be further coupled to the bias element 702. The control unit 706 is configured to selectively operate the bias element 702 to apply a non-zero bias voltage to the plurality of bit-lines $BL_1$-$BL_n$ and/or the plurality of select-lines $SL_1$-$SL_n$ during a read operation. In some embodiments, the bias element 702 may comprise a bias element decoder 712. The bias element decoder 712 is configured to receive the second address $ADDR_{BL/SL}$ and to selectively apply a bias voltage based upon the second address $ADDR_{BL/SL}$. For example, based upon the second address $ADDR_{BL/SL}$ the bias element decoder 712 may be configured to apply a non-zero bias voltage to selected and unselected bit-lines, to unselected select-lines, but not to a selected select-line. In some alternative embodiments, the bias element decoder 712 may be configured to receive an address from the control unit 706 that is different than the second address $ADDR_{BL/SL}$.

In some embodiments, the control unit 706 is configured to operate the bias element 702 to not apply a non-zero bias voltage to the plurality of bit-lines $BL_1$-$BL_n$ and/or the plurality of select-lines $SL_1$-$SL_n$ during forming, set, and/or reset operations on the RRAM array 102. For example, in various embodiments, the bias element 702 may be decoupled from the plurality of bit-lines $BL_1$-$BL_n$ and/or the plurality of select-lines $SL_1$-$SL_n$ and/or turned off during forming, set, and/or reset operations.

Therefore, in some embodiments, the present disclosure relates to a method and apparatus for performing a read operation of an RRAM cell, which applies a non-zero bias voltage to bit-lines and select-lines coupled to unselected RRAM cells during the read operation to increase a read current window without damaging corresponding access transistors.

In some embodiments, the present disclosure relates to a method of operating an RRAM array that comprises performing a read operation of a selected RRAM device. The read operation is performed by activating a word-line coupled to a row of RRAM cells within an RRAM array by applying a first read voltage to the word-line. The row of RRAM cells comprises the selected RRAM device. The read operation is performed by further applying a second read voltage to a bit-line coupled to a first electrode of the selected RRAM device, and by applying one or more non-zero bias voltages to bit-lines and select-lines coupled to RRAM cells, within the row of RRAM cells, which have unselected RRAM devices.

In other embodiments, the present disclosure relates method of operating an RRAM array that comprises performing a read operation of a selected RRAM device. The read operation is performed by applying a first non-zero voltage to a word-line coupled to a row of RRAM cells within an RRAM array. The row of RRAM cells comprises the selected RRAM device. The read operation is performed by further applying a second non-zero voltage to a bit-line coupled to a first electrode of the selected RRAM device, and by applying a substantially zero voltage to a select-line operably coupled to a second electrode of the selected RRAM device. The read operation is performed by further applying a non-zero bias voltage to bit-lines and select-lines coupled to RRAM cells, within the row of RRAM cells, which have unselected RRAM devices.

In yet other embodiments, the present disclosure relates an integrated chip. The integrated chip comprises an RRAM array having a plurality of RRAM cells. The integrated chip further comprises a word-line decoder configured to apply a first read voltage to a word-line coupled to a row of RRAM cells within the RRAM array. The row of RRAM cells comprises a selected RRAM device. The integrated chip further comprises a bit-line decoder configured to apply a second read voltage to a bit-line coupled to a first electrode of the selected RRAM device. The integrated chip further comprises a bias element configured to apply a non-zero bias voltage to bit-lines and select-lines coupled to RRAM cells, within the row of RRAM cells, which have unselected RRAM devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a resistive random access memory (RRAM) array, comprising:
applying a word-line voltage to a selected word-line during a read operation;
applying a non-zero voltage to a selected bit-line during the read operation; and
applying a first voltage to a selected source-line during the read operation that is smaller than a second voltage applied to an unselected source-line during the read operation.

2. The method of claim 1, further comprising:
applying a third voltage to an unselected bit-line and a fourth voltage to the selected bit-line during the read operation, wherein a difference between the first voltage and the fourth voltage is larger than a difference between the second voltage and the third voltage.

3. The method of claim 2, wherein the third voltage is substantially equal to the fourth voltage.

4. The method of claim 3, further comprising:
applying a set voltage to the selected word-line during a set operation, wherein the set voltage is less than the word-line voltage.

5. The method of claim 1, further comprising:
applying a set voltage to the selected word-line during a set operation, wherein the set voltage is approximately equal to a difference between the word-line voltage and the second voltage.

6. The method of claim 1, further comprising:
applying a substantially zero voltage to the unselected source-line during a forming operation.

7. The method of claim 1, wherein the read operation is configured to provide for a current window of approximately 11 micro-amperes between a first data state and a second data state.

8. The method of claim 1,
wherein the selected word-line is coupled to a gate of an access transistor; and
wherein a difference between the word-line voltage and the first voltage is less than a voltage that causes damage to a gate dielectric of the access transistor.

9. The method of claim 1, wherein the word-line voltage is approximately equal to 1.4 volts and the first voltage is approximately equal to 0 volts.

10. A method of operating a resistive random access memory (RRAM) array, comprising:
applying a word-line voltage to a selected word-line during a read operation; and
applying a first voltage to a selected source-line and a second voltage to an unselected source-line during the read operation, wherein a difference between the word-line voltage and the first voltage is larger than a difference between the word-line voltage and the second voltage.

11. The method of claim 10,
wherein the selected word-line is coupled to a first gate of a first access transistor having a first source coupled to the selected source-line; and
wherein the word-line voltage has a value that is large enough to cause damage to a gate dielectric of the first access transistor.

12. The method of claim 11,
wherein the selected word-line is coupled to a second gate of a second access transistor having a second source coupled to the unselected source-line; and
wherein the difference between the word-line voltage and the second voltage has a value that is not large enough to cause damage to the gate dielectric of the second access transistor.

13. The method of claim 11, further comprising:
applying a second word-line voltage to the selected word-line during a set operation, wherein the second word-line voltage is not large enough to cause damage to the gate dielectric of the first access transistor.

14. The method of claim 10, further comprising:
applying a third voltage a selected bit-line and a fourth voltage to an unselected bit-line during the read operation; and
wherein the third voltage is different than the first voltage.

15. The method of claim 14, wherein the second voltage is substantially equal to the fourth voltage.

16. The method of claim 14, further comprising:
applying a second word-line voltage to the selected word-line during a set operation, wherein the word-line voltage is larger than the second word-line voltage.

17. A method of operating a resistive random access memory (RRAM) array, comprising:
applying a first word-line voltage to a selected word-line coupled to a gate of an access transistor during a set operation; and
applying a second word-line voltage to the selected word-line during a read operation, wherein the second word-line voltage is larger than the first word-line voltage.

18. The method of claim 17, further comprising:
applying a first voltage to an unselected bit-line and a second voltage to an unselected source-line during the read operation, wherein the first voltage is substantially equal to the second voltage.

19. The method of claim 18,
wherein the second word-line voltage is large enough to cause damage to a gate dielectric of the access transistor; and
wherein a difference between the second word-line voltage and the first voltage is not large enough to cause damage to a gate dielectric of a second access transistor coupled to the unselected bit-line.

20. The method of claim 17, further comprising:
applying a first voltage to a selected source-line and a second voltage to unselected source-lines during the read operation, wherein the first voltage is smaller than the second voltage.

* * * * *